(12) United States Patent
Norman

(10) Patent No.: US 7,996,600 B2
(45) Date of Patent: *Aug. 9, 2011

(54) MEMORY EMULATION IN AN ELECTRONIC ORGANIZER

(75) Inventor: Robert Norman, Blaine, WA (US)

(73) Assignee: Unity Semiconductor Corporation

( * ) Notice: Subject to any disclaimer, the term of this patent is extended or adjusted under 35 U.S.C. 154(b) by 424 days.

This patent is subject to a terminal disclaimer.

(21) Appl. No.: 11/897,909

(22) Filed: Aug. 30, 2007

(65) Prior Publication Data

US 2009/0063757 A1 Mar. 5, 2009

(51) Int. Cl.
*G06F 12/00* (2006.01)

(52) U.S. Cl. ..... 711/103; 711/112; 703/23; 365/185.29; 365/185.33

(58) Field of Classification Search .................. 711/103, 711/112, 115, E12.001, E12.008; 365/185.29, 365/185.33; 703/23

See application file for complete search history.

(56) References Cited

U.S. PATENT DOCUMENTS

| 6,034,882 | A | 3/2000 | Johnson et al. |
| 7,460,385 | B2 | 12/2008 | Gruber et al. |
| 7,519,754 | B2 * | 4/2009 | Wang et al. .................... 710/110 |
| 2002/0003722 | A1 * | 1/2002 | Kanda et al. ............. 365/185.17 |
| 2003/0151959 | A1 | 8/2003 | Tringali et al. |
| 2004/0170040 | A1 * | 9/2004 | Rinerson et al. ................ 365/26 |
| 2006/0050598 | A1 | 3/2006 | Rinerson et al. |
| 2006/0083069 | A1 * | 4/2006 | Fasoli ...................... 365/185.19 |
| 2006/0164882 | A1 | 7/2006 | Norman |
| 2006/0171200 | A1 | 8/2006 | Rinerson et al. |

OTHER PUBLICATIONS

U.S. Appl. No. 11/897,726, filed Aug. 31, 2007, Robert Norman.
U.S. Appl. No. 11/893,647, filed Aug. 16, 2007, Robert Norman.
U.S. Appl. No. 11/893,644, filed Aug. 16, 2007, Robert Norman.
U.S. Appl. No. 11/665,599, filed Jan. 19, 2007, Robert Norman.
U.S. Appl. No. 11/543,502, filed Oct. 5, 2006, Robert Norman.
U.S. Appl. No. 11/506,385, filed Aug. 16, 2006, Robert Norman.
U.S. Appl. No. 11/478,163, filed Jun. 28, 2006, Robert Norman.
U.S. Appl. No. 11/449,105, filed Jun. 6, 2006, Robert Norman.

* cited by examiner

*Primary Examiner* — Jasmine Song

(57) ABSTRACT

An electronic organizer using a memory array that is directly addressed and non-volatile is disclosed. The memory array can be used to replace and emulate multiple memory types such as DRAM, SRAM, non-volatile RAM, FLASH memory, and a non-volatile memory card, for example. The memory array may be randomly accessed. Data stored in the memory array is retained in the absence of electrical power. One or more memory arrays may be used in the electronic organizer. At least one of the memory arrays may be in the form of a removable memory card.

22 Claims, 7 Drawing Sheets

MEMORY EMULATION IN AN ELECTRONIC ORGANIZER

FIELD OF THE INVENTION

The present disclosure relates to electronic systems. More specifically, the present disclosure relates to memory technology in an electronic organizer.

BACKGROUND

Memory is required for any device that stores instructions and/or data. Memory can either be classified as volatile or nonvolatile. Volatile memory is memory that loses its contents when the power is turned off. In contrast, non-volatile memory may not require a continuous power supply to retain information. Non-volatile memories may use solid-state memory devices as memory elements.

One type of volatile memory is random access memory (RAM). As the name suggests, RAM may be accessed in any order so long as the address, or intersecting row (word line) and column (bit line), of the desired cells are known.

There are several kinds of volatile RAM. One type is dynamic random access memory (DRAM). DRAM is named for its refresh operation. In DRAM, a transistor and capacitor are used to create a memory cell. The capacitor holds electrons that represent a bit of data (i.e., a 1 or a 0), while the transistor is used as a switch to read the capacitor or to change its state. However, the capacitor begins to lose the electrons immediately and uses the refresh procedure, prior to the electrons discharging past the 50% mark, to hold a state of 1. That is, the central processing unit (CPU), or a memory controller, may be used to charge the capacitors that have a state of 1. This refreshing operation allows the capacitors to maintain that high state while actively discharging. Refreshing occurs automatically thousands of time per second, and consumes CPU time and resources.

DRAM may be configured to use Direct Memory Access (DMA) to write to the memory. DMA is a method of writing to a device without passing through a CPU. The data may be sent directly through a physical DMA channel to the memory; the CPU is not involved. This method of memory writing is more efficient than the Program Input Output (PIO) method in which the CPU manages the data transfer. However, the Row Address Signal/Column Address Signal (RAS/CAS) multiplexing creates some overhead.

Since the DRAM circuit is small, many bits may be stored on a single chip making DRAM relatively inexpensive. The relative inexpensiveness of DRAM accounts for its widespread use as computer system RAM. However, the refreshing operation may make DRAM less efficient, and thus slower, and draw more power than other RAM types.

Another type of volatile RAM is static random access memory (SRAM). SRAM stores each bit of data in a flip-flop circuit. The flip-flip circuit may include a group of transistors (e.g., 4 to 6 transistors) and the corresponding wiring, taking up more space than the DRAM circuit. In some embodiments, a large current may be used to overcome the impedance of the circuitry and wiring. SRAM may be configured to use DMA to access the memory directly. The direct access and the lack of a refresh operation make SRAM faster than DRAM. However its larger circuit size may consume more space providing fewer memory cells per chip, making SRAM more expensive per chip than DRAM.

Non-volatile memory may be referred to as FLASH memory, and uses solid state technology that can still be randomly accessed. Non-volatile RAM may use a battery to draw power to maintain the data. For example, a car radio uses non-volatile RAM to store preset radio stations. The stored preset stations are maintained when the car is turned off, but are lost if the car battery dies. The non-volatile RAM draws power from the battery to maintain the data values. Non volatile memory cards differ from non-volatile RAM in that non-volatile memory cards do not lose data upon power loss. Neither non-volatile RAM nor non-volatile memory cards use a refresh operation. However, non-volatile RAM (e.g., FLASH memory) and non-volatile memory cards (e.g., FLASH memory cards such as a SD™ card) utilize an erase operation prior to writing. That is, non-volatile memory is not able to perform consecutive, or back to back, write operations. Data must be erased prior to the next write. A block of data may be erased at one time using one action, or one "flash." It is from this erase process that the name "FLASH memory" was drawn. The erase process also causes non-volatile RAM and non-volatile memory cards to be too slow for widespread use, but useful in certain applications, for example as a portable data storage option.

Thus, volatile DRAM is inexpensive, volatile SRAM is fast, Non-volatile RAM retains stored data when the power is turned off, and a non-volatile memory card is portable and retains stored data through a power loss. As a result, manufacturers may use a combination of these memory types to be able to offer users differing functionality. For example, an electronic organizer, such as a personal digital assistant (PDA), or a device that includes electronic organizer functionality may include several memory types that support device operation and/or data storage functions, such as DRAM, SRAM, FLASH, and EEPROM. However, mixing memory types may have drawbacks including but not limited to circuitry and software necessary to support interfacing a CPU and/or a memory controller with the various memory types, the extra PC board space required to support each memory type and its associated hardware, increased power consumption and heat dissipation created by multiple memory types, just to name a few. For portable electronic devices, reducing power consumption to extend battery life is a major design goal. There are continuing efforts to improve memory technology in electronic organizers.

BRIEF DESCRIPTION OF THE DRAWINGS

The present embodiments will be readily understood by the following detailed description in conjunction with the accompanying Drawings, and like reference numerals designate like structural elements.

Although the Drawings depict various examples of the invention, the invention is not limited by the depicted examples. Furthermore, the depictions are not necessarily to scale.

DETAILED DESCRIPTION

The present invention may be implemented using numerous means, including as a system, an apparatus, a method, or any combination of those means.

A detailed description of one or more examples is provided below along with accompanying figures. The detailed description is provided in connection with such examples, but is not limited to any particular embodiment. The scope is limited only by the claims, and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

This disclosure describes memory emulation in an electronic organizer. In some embodiments a non-volatile memory array emulates SRAM, or DRAM, or both. In some other embodiments the non-volatile memory array emulates SRAM and non-volatile RAM. In some other embodiments the non-volatile memory array emulates SRAM, non-volatile RAM, and DRAM. In some other embodiments a second non-volatile memory array emulates a non-volatile memory card. These embodiments are for illustration only; the non-volatile memory array and/or non-volatile memory array card can emulate other types and combinations of memory as well.

The above described embodiments may be practiced with other computer system configurations including hand-held devices, microprocessor systems, DSP systems, microprocessor-based or programmable consumer electronics, mini-computers, mainframe computers and the like. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order, of operation, unless explicitly stated in the claims.

Figure 1:
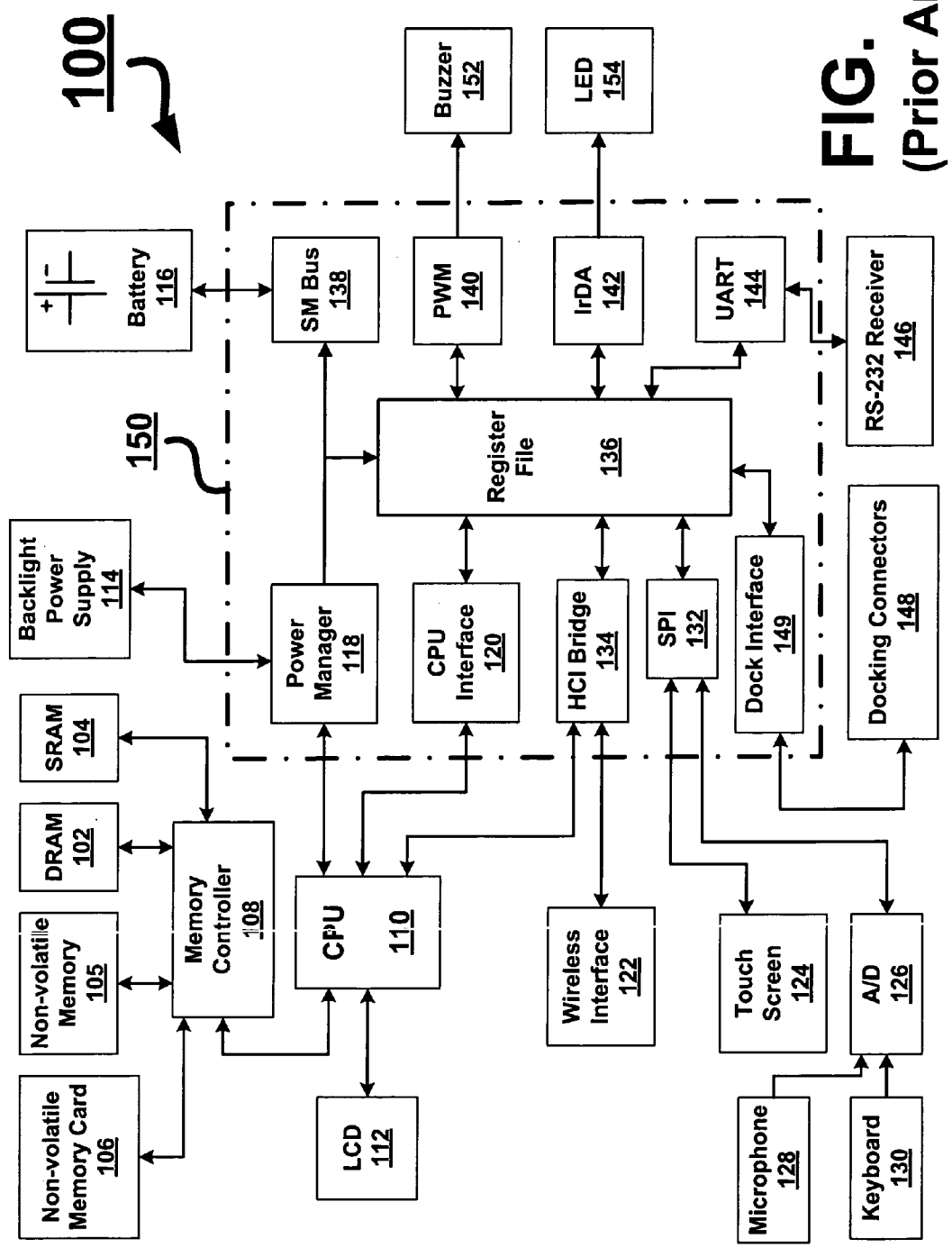
FIG. 1 is an exemplary representation of a conventional electronic organizer.

FIG. 1 is an exemplary representation of a conventional electronic organizer 100. For example, electronic organizers may be stand alone devices, or in some embodiments, electronic organizers may be included in a mobile phone (e.g., a cell phone or cellular telephone), a portable electronic device (e.g., a BlackBerry® or IPhone™), a personal digital assistant (PDA), a device that includes electronic organizer functionality (e.g., a computer), a device that includes any combination of the aforementioned devices, just to name a few. Electronic organizers generally provide personal information management (PIM) functions, run application software, and synchronize with personal computers. Synchronization may occur via one or more interfaces such as a docking connector 148 that communicates with a register file 136 through a dock interface 149, a wireless interface 122, and a universal serial bus (USB™) interface (not shown), for example. PIM may handle contact information, to-do lists, taking notes, tracking appointments, reminder alarms, calendar management, email management, and performing calculations. Applications may include pocket versions of back office programs, such as word processing, presentation software, email software, spreadsheet, and web browser applications.

Electronic organizer 100 has a central processing unit (CPU) 110. CPU 110 orchestrates the operation of the electronic organizer 100 and may contain an operating system or pre-programmed instructions. CPU 110 may have three main functions—power management, IO management, and memory management. A logic block 150 may be used to perform various logic functions of the electronic organizer 100. In some applications, the logic block 150 can be implemented using one or more programmable logic devices, such as a Field Programmable Gate Array (FPGA), for example. In other applications, such as in some high volume applications, the logic block 150 may be implemented using at least one custom Application Specific Integrated Circuit (ASIC) that will offer lower power and lower cost. One skilled in the art will appreciate that the logic block 150 can be implemented using any combination of the aforementioned devices.

CPU 110 utilizes power manager 118 and SM bus 138 to manage the power for the electronic organizer 100. IO management may be accomplished via a pulse width modulation (PWM) interface 140, an infra red interface 142 (IrDA®), a Universal Asynchronous Receiver Transmitter 144 (UART), and a Serial Parallel Interface 132 (SPI). One skilled in the art will appreciate that IO management can be handled by other interface technologies including but not limited to USB™, Bluetooth®, wireless local area network (WLAN), IEEE 1394, FireWire®, and i.LINK®, for example. CPU 110 communicates with these IO interfaces via CPU interface 120. PWM 140 may be coupled to buzzer 152 such that CPU 110 may drive the speaker to produce sound. IrDA® logic 142 may be coupled to light emitting diode (LED) 154 to indicate receiving or transmitting of data. UART 144 may be coupled to RS-232 receiver 146. SM bus 138 may be coupled to battery 116. Power Manager 118 may be coupled to backlight power supply 114 for providing backlight to a LCD display 112. Additional IO management may be accomplished via HCl bridge 134 which provides wireless interface logic, and via SPI logic 132 which receives touch screen and digital inputs. Analog to digital converter 126 receives sound input via microphone 128 and analog data via keyboard 130. In some embodiments, electronic organizer 100 may include additional interfaces, such as a multimedia connection, digital camera, and a Secure Digital I/O (SDIO) to allow interfacing with additional peripherals such as a WiFi card, a GPS card, or a biometric fingerprint reader.

Electronic organizer 100 may use read-only memory (ROM) to store the basic programs it may need for operation so that the programs stay intact even when the device is shut down or power is lost. The data and any programs added later may be stored in random-access memory (RAM) such as static random access memory (SRAM) 104, dynamic random access memory (DRAM) 102, and non-volatile memory (FLASH) 105. In some embodiments, data may be available when the electronic organizer 100 is powered on and is kept safe by continuing to draw power from the batteries when the electronic organizer 100 is powered down. In some embodiments, electronic organizer 100 may use a non-volatile memory card 106 instead of, or in addition to, RAM.

Figure 2A:
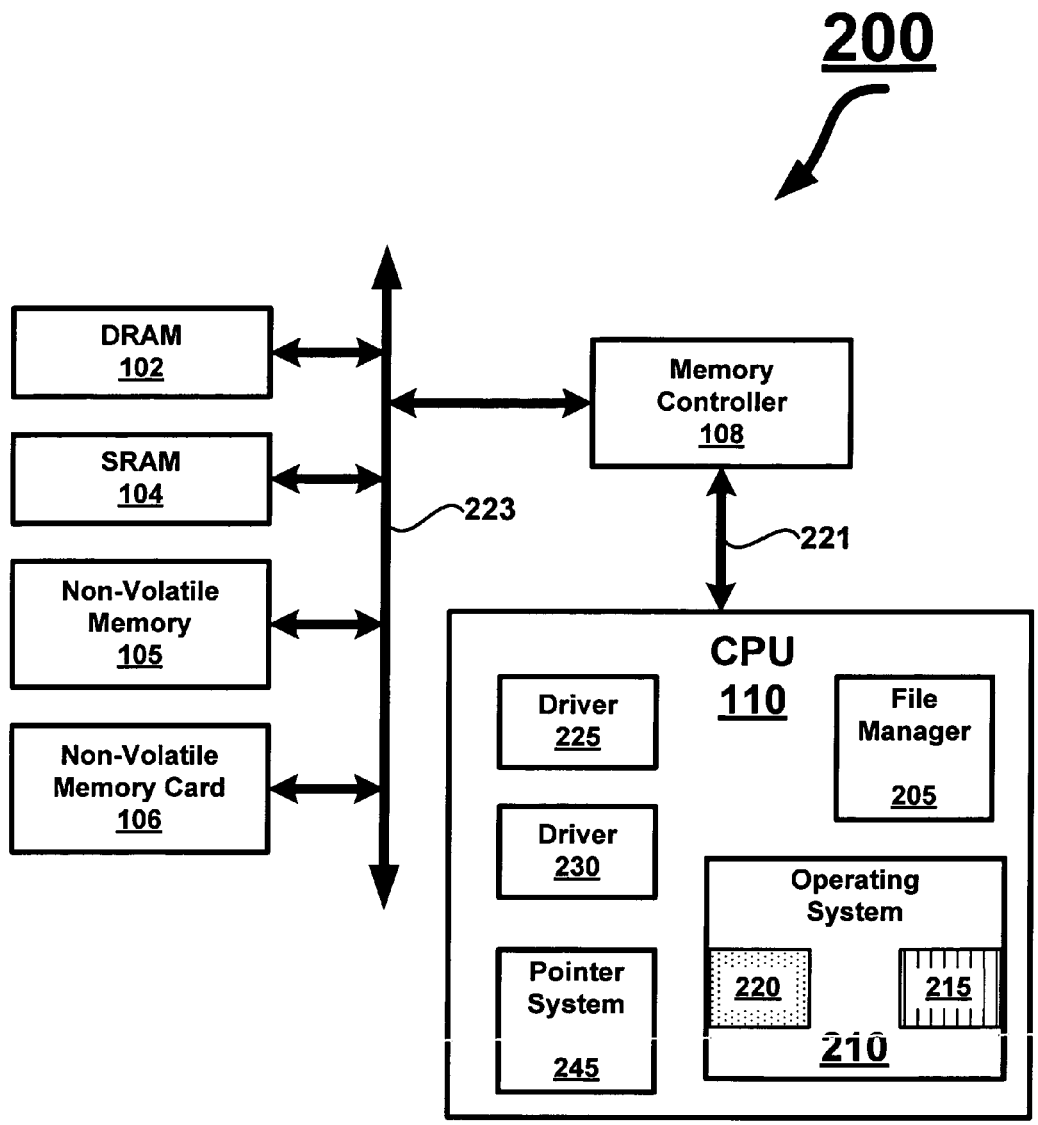
FIG. 2A is an exemplary representation of a conventional memory system of the conventional electronic organizer depicted in FIG. 1.

FIG. 2A is an exemplary representation of a conventional memory system 200 for the conventional electronic organizer 100. Memory system 200 includes the CPU 110. Within the CPU 110 may be a file manager 205, an operating system 210, one or more drivers 225 and 230, and pointer system 245. The file manager 205 may be configured to understand the file structure of the non-volatile memory 105 and may be used to translates the data from this structure into a form the CPU 110 can use (e.g., from a memory bus 223 to a CPU bus 221). CPU operating system 210 may be used to control the other devices in the electronic organizer 100 such as memory and I/O, possibly requiring additional drivers.

Each memory type has different infrastructure needs. DRAM 102 uses a refresh operation to maintain its data. This refresh operation may be managed by memory controller 108. The CPU 110 may coordinate the power manager 118 and SM bus 138 to provide power from battery 116 to DRAM 102. In another embodiment, the refresh operation may be managed by memory controller 108. Memory controller 108 may be used to handle the interface-to-interface translation functions which translate the data from the memory bus 223 to the CPU bus 221. In some embodiments, memory controller 108 may be used to handle direct memory addressing (DMA) functions. DMA may speed up image storage if electronic organizer 100 includes image capture capability (e.g., incorporates a digital camera and/or a digital video recorder).

SRAM 104 uses flip-flops instead of a capacitance circuit and does not perform a refresh operation. CPU 110 may coordinate power manager 118 and SM bus 138 to provide power from battery 116 to SRAM 104 for maintaining data values. If the SRAM 104 is in use, then power is needed. On the other hand, if the SRAM 104 is not in use, then the power may be switched off to conserve power in battery 116. However, like the DRAM 102, the SRAM 104 is volatile and stored data is lost when power is switched off. Memory controller 108 may be used to handle the interface-to-interface translation functions which translate the data from the memory bus 223 to the CPU bus 221.

The erase process of non-volatile memory 105 utilizes high voltages (e.g., 10-13 volts) that erase a block of data at a time. This erase process may be time consuming. In some embodiments, for example, a user may enter a new contact on keyboard 130. Analog to digital converter 126 may convert the analog data into digital data. SPI 132 may bring the digital signal to register file 136. CPU 110 may access the digital data through CPU interface 120, display the data on liquid crystal display (LCD) 112, and store the digital data in nonvolatile memory 105. However, as mentioned previously, nonvolatile, or FLASH, memory has drawbacks.

FLASH memory may use a driver, an operating system, and a pointer system. The driver may be used to translate the control parameters used to read, write and erase data. The driver resides in CPU 110 to allow the CPU 110 to drive the FLASH IO. The complexity of the FLASH memory erase process results in the need for the operating system and pointer system. That is, a write operation sets certain bits to a 1 value, and an erase sets all bits in a block to a 0 value. However, writing a 0 to a location that already contains a 1 will have no effect. For example, a byte of written data (in hexadecimal notation) may contain 0x55 (0101 0101). If the system writes a complimentary pattern of 0xAA (1010 1010) the result is 0xFF (1111 1111) not the desired 0xAA because only the 1 data locations can be written. An erase operation is required in FLASH to set any bit values to 0. It is the operating system that utilizes the pointer system to manage the erase process.

The erase operation may be slow and as such the operating system, sometimes referred to as FLASH File System (FFS), may move data to minimize the number of erases. Data may be moved, that is, written to a new location, instead of performing an erase and write. The location to where the data is moved may be tracked by the pointer system. The pointer system may use overhead data such as markers and address pointer values that are stored in the FLASH memory. The FLASH memory may fill at a more rapid pace due to the moving of data and the storing of the overhead values.

Once a FLASH block is full or contains a large amount of obsolete data (i.e., data that has been moved to a new location) it may be scheduled for erasure. The good data in the block may be moved to SRAM 104 or another FLASH block so that it is retained. If FLASH is used, markers and address pointer values are stored. Then the scheduled erasure can take place. The erase process may include a cycle of erases and reads. The cycle of erases and reads may be continued until all the block values reach the erased state. The erase cycle is slow and uses high voltages for long periods of time which may cause high currents and battery drain. Once in the erased state, the block can accept a write. This multi-step process which includes moving data, tracking addresses, storing overhead values, and erasing, may cause FLASH memory to be slow and impacts the performance of the system as a whole. Moreover, other drawbacks to FLASH memory include the circuitry required to provide the high voltages and the power drain created by the high voltages. For portable devices, it is desirable to minimize power drain and reduce the area taken up by circuitry.

The CPU 110 may coordinate the power manager 118 and SM bus 138 to provide power from battery 116 to non-volatile memory 105. When power is supplied to the non-volatile memory 105 and the memory is given an erase command, the internal circuitry in the non-volatile memory 105 activates causing charge pumps to generate a high voltage and start the logic sequence.

In some embodiments, FLASH File System may run on the CPU 110, consuming a portion of the CPU 110 computing resources and memory. This burden on operating system 210 may be illustrated by FLASH File System load 220. FLASH File System also utilizes file manager 205, driver 225, and pointer system 245. File manager 205 may be configured to understand the file structure of the non-volatile memory 105 and may be used to translate data from the memory bus 223 to the CPU bus 221. Driver 225 may be used to determine the driving sequences for accessing non-volatile memory 105. Pointer system 245 keeps track of data as was described above.

Non-volatile memory card 106 functions similarly to non-volatile memory 105. The erase process of non-volatile memory card 106 may utilize high voltages (e.g., 10-13 volts) that erase a block of data at a time. This erase process may be time consuming. FLASH File System software may be used for the purpose of data management of non-volatile memory card 106. FLASH File System software may be used to manage the slowness and the size of the erase by moving data between blocks to maximize data concentration and minimize quantity of erases, and manage the erase process itself.

Data blocks for non-volatile memory card 106 may be a different size than the block size for non-volatile memory 105. The CPU 110 may coordinate the power manager 118 and SM bus 138 to provide power from battery 116 to non-volatile memory card 106. When power is supplied to the non-volatile memory card 106 and the memory is given an erase command, the internal circuitry in the non-volatile memory card 106 activates causing charge pumps to generate a high voltage and start the erase logic sequence.

In one embodiment, FLASH File System may run on the CPU 110, consuming a portion of the CPU 110 computing resources and memory. This burden on operating system 210 may be illustrated by FLASH File System load 220. In another embodiment, FLASH File System may run on an on-board controller resident on non-volatile memory card 106. In this embodiment, the operating system 210 is configured to poll the on-board controller to determine if the FLASH memory is available, or busy (i.e., performing an erase operation). The polling function in the operating system may be represented by FLASH File System polling load 215. In either embodiment, the operating system 210 is loaded down with either the FLASH File System itself and with polling for the status of the on-board controller of FLASH memory, or in some other embodiments the CPU 110 is loaded down with both loads 215 and 220.

FLASH File System also utilizes file manager 205, driver 230, and pointer system 245. File manager 205 may be configured to understand the file structure of the non-volatile memory card 106 and may be used to translate data from the memory bus 223 to the CPU bus 221. Driver 230 may be used to determine the driving sequences for accessing non-volatile memory card 106.

There are several drawbacks to the conventional electronic organizer 100 and the conventional memory system 200. Battery 116 could fail while the data is being stored in volatile memory, such as the DRAM 102 or the SRAM 104, losing the data. The multiple memory types included have different operational methods and place different loads on CPU 110 causing inefficiencies. The erase operation for the non-volatile memories 105 and 106 result in slower system throughput and burden the CPU 110 with additional drivers, loads, and a pointer system.

Non-volatile memory technologies may be used with memory systems to develop high density, low cost, and fast access memories. Access may refer to accessing and performing data operations (e.g., read, write, erase) on a memory or memory array. Preferably, a non-volatile, cross-point, high density memory array that uses direct memory addressing, has a fast read/write capability, and uses neither an erase process, nor any added code in the operating system is used to replace one or more of the aforementioned multiple memory types. Examples of non-volatile memory arrays may include two-terminal or three-terminal cross-point memory arrays configured as a single layer array or as multiple layer vertically-stacked arrays. An exemplary non-volatile two-terminal cross-point memory array is described in U.S. patent application Ser. No. 11/095,026, filed Mar. 30, 2005, U.S. Published Application No. 2006/0171200 and titled "Memory Using Mixed Valence Conductive Oxides," hereby incorporated by reference in its entirety and for all purposes. The application describes non-volatile third dimension memory cells that can be arranged in a cross-point array and describes a two terminal memory element that changes conductivity when exposed to an appropriate voltage drop across the two terminals. The memory element includes both a mixed ionic electronic conductor and a layer of material that has the bulk properties of an electrolytic tunnel barrier (i.e., properties of an electronic insulator and an ionic conductor). A voltage drop across the electrolytic tunnel barrier causes an electrical field within the mixed ionic electronic conductor that is strong enough to move oxygen ($O_2$) ions out of the mixed ionic electronic conductor and into the electrolytic tunnel barrier. Oxygen depletion causes the mixed ionic electronic conductor to change its conductivity. Both the electrolytic tunnel barrier and the mixed ionic electronic conductor do not need to operate in a silicon substrate, and, therefore, can be fabricated above circuitry being used for other purposes (e.g., selection circuitry, sense amps, and address decoders). A memory is "third dimension memory" when it is fabricated above other circuitry components, the components usually including a silicon substrate, polysilicon layers and, typically, metallization layers, for example.

The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying $\frac{1}{2}V_{W1}$ to the x-direction line and $\frac{1}{2}-V_{W1}$ to the y-direction line) it switches to a low resistive state. When a second write voltage $V_{W2}$ is applied across the memory element, (typically by applying $\frac{1}{2}V_{W2}$ to the x-direction line and $\frac{1}{2}-V_{W2}$ to the y-direction line) it switches to a high resistive state. Typically, memory elements using electrolytic tunnel barriers and mixed ionic electronic conductors require $V_{W1}$ to be opposite in polarity from $V_{W2}$. Typically, a magnitude of the voltage applied across the memory element for data operations (e.g., read or write) is less than approximately 10 volts. More preferably, the magnitude of the voltage applied across the memory element is less than approximately 7 volts.

In applications requiring high density data storage in a small footprint memory device, two-terminal cross-point memory arrays are preferable over three-terminal cross-point memory arrays because the extra area required to route the interconnect lines that electrically couple with the third terminal in the three-terminal cross-point memory array reduces a real density and increases die size and device footprint. Therefore, given the same die size, a two-terminal cross-point memory array will have a higher data storage density than the three-terminal cross-point memory array. An electronic organizer can incorporate one or more of the non-volatile cross-point memory arrays to replace some or all of the aforementioned multiple memory types (e.g., DRAM, SRAM, FLASH, FLASH memory cards, ROM, and EEPROM).

Figure 2B:
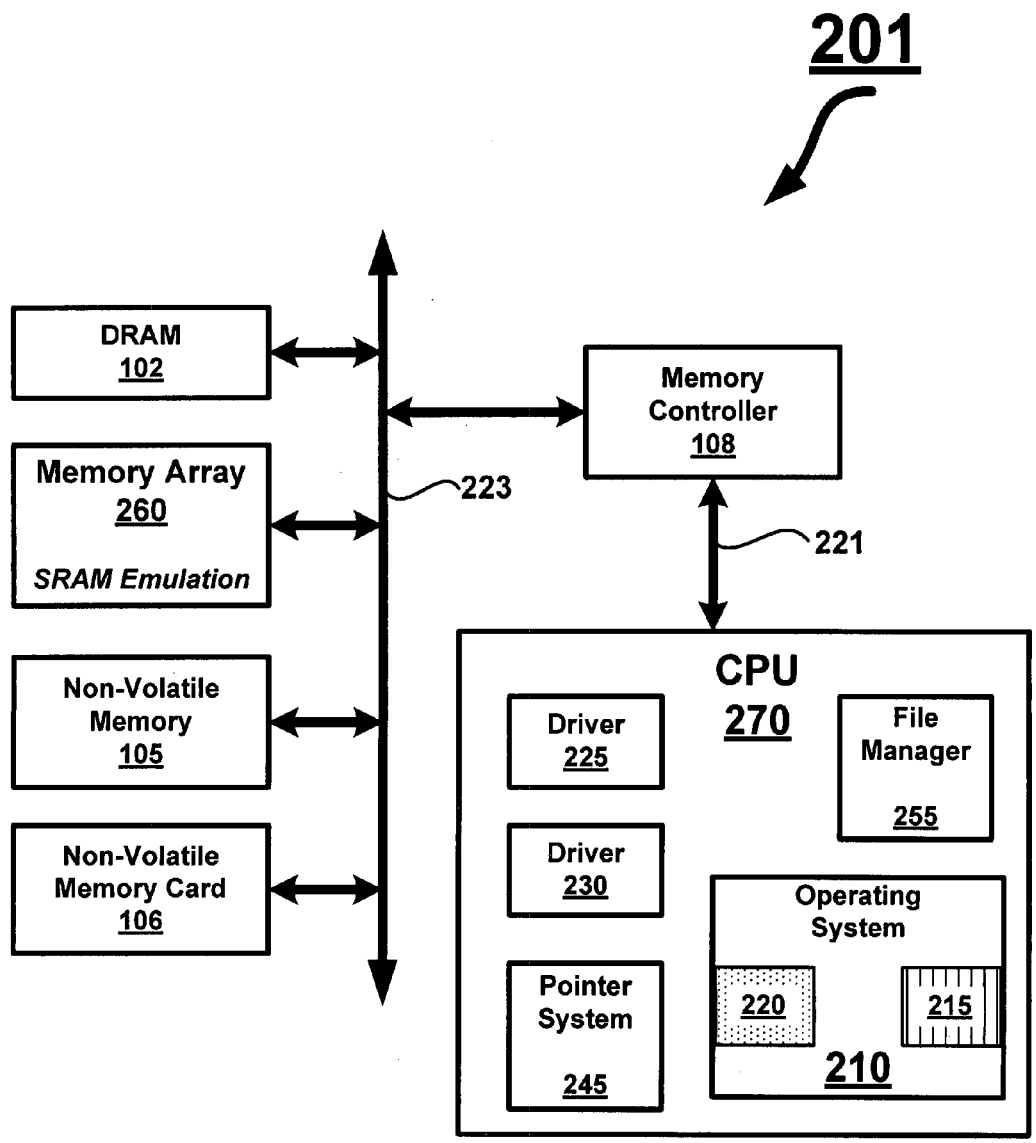
FIG. 2B is an exemplary representation of a memory system in an electronic organizer using a non-volatile memory array to replace and emulate SRAM.

The memory array can emulate multiple memory types and may be used to replace any one or combination of those types. For example, FIG. 2B is an exemplary representation of a memory system 201 in which a non-volatile memory array 260 may be used to replace and emulate SRAM 104. That is, non-volatile memory array 260 can be accessed randomly using PIO while eliminating the expense and size needs associated with SRAM 104. Alternatively, DMA may be used to access non-volatile memory array 260. File manager 255 may be configured to understand the file structure of the non-volatile memory array 260 and may be used to translate data from the non-volatile memory array 260 to the CPU bus 221. Memory controller 108 may be used to perform interface functions for the non-volatile memory array 260. CPU 270 includes operating system 210 bearing polling and system loads 215 and 220 respectively, and pointer system 245. In the system 201, the SRAM 104 has been replaced with non-volatile memory array 260 thus eliminating the expense of SRAM while maintaining random access.

Figure 2C:
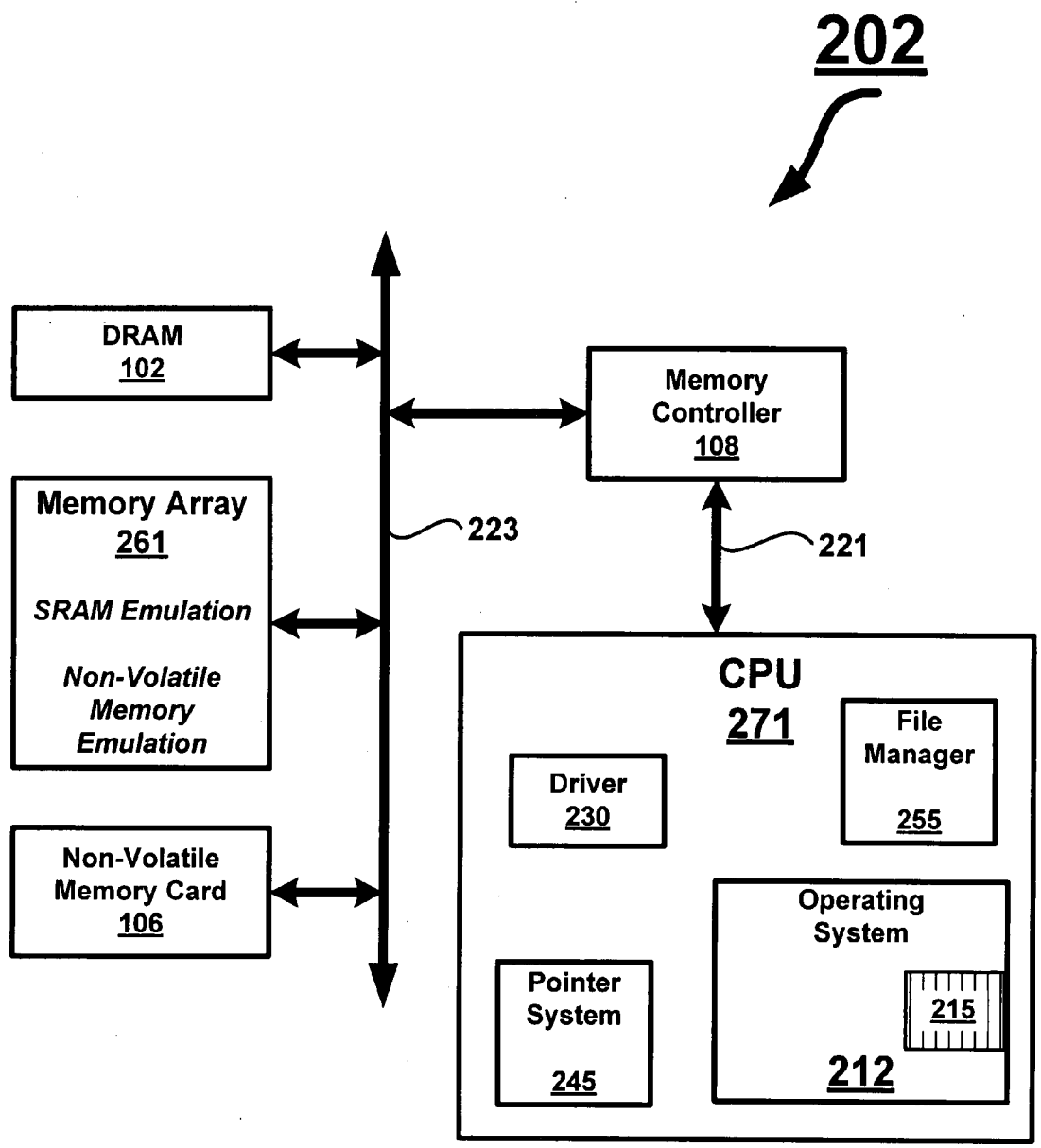
FIG. 2C is an exemplary representation of a memory system in an electronic organizer using a non-volatile memory array to replace and emulate both SRAM and non-volatile memory.

FIG. 2C is an exemplary representation of a memory system 202 in which a non-volatile memory array 261 may be used to replace and emulate a combination of SRAM 104 and non-volatile memory 105. That is, non-volatile memory array 261 can be accessed randomly (e.g., using PIO or DMA) while eliminating the expense associated with SRAM 104, or the erase operation such as that used with non-volatile memory 105, thus simplifying CPU 271 operations. File manager 255 may be configured to understand the file structure of the non-volatile memory array 261 and may be used to translate data from the non-volatile memory array 261 to the CPU bus 221. Memory controller 108 may be used to perform interface functions for the non-volatile memory array 261. CPU 271 includes operating system 212 bearing polling load 215. Note that the Flash File System load 220 has been eliminated from operating system 212. Furthermore, driver 225 has also been eliminated from CPU 271. In the system 202, the SRAM 104 and the non-volatile memory 105 have been replaced with non-volatile memory array 261 thus eliminating the expense associated SRAM 104 and the erase operation associated with non-volatile memory 105 while maintaining fast random read/write access and adding non-volatile functionality to the memory by replacing the SRAM 104 with non-volatile memory array 261. In some embodiments, DMA functions may be maintained or added as well.

Figure 2D:
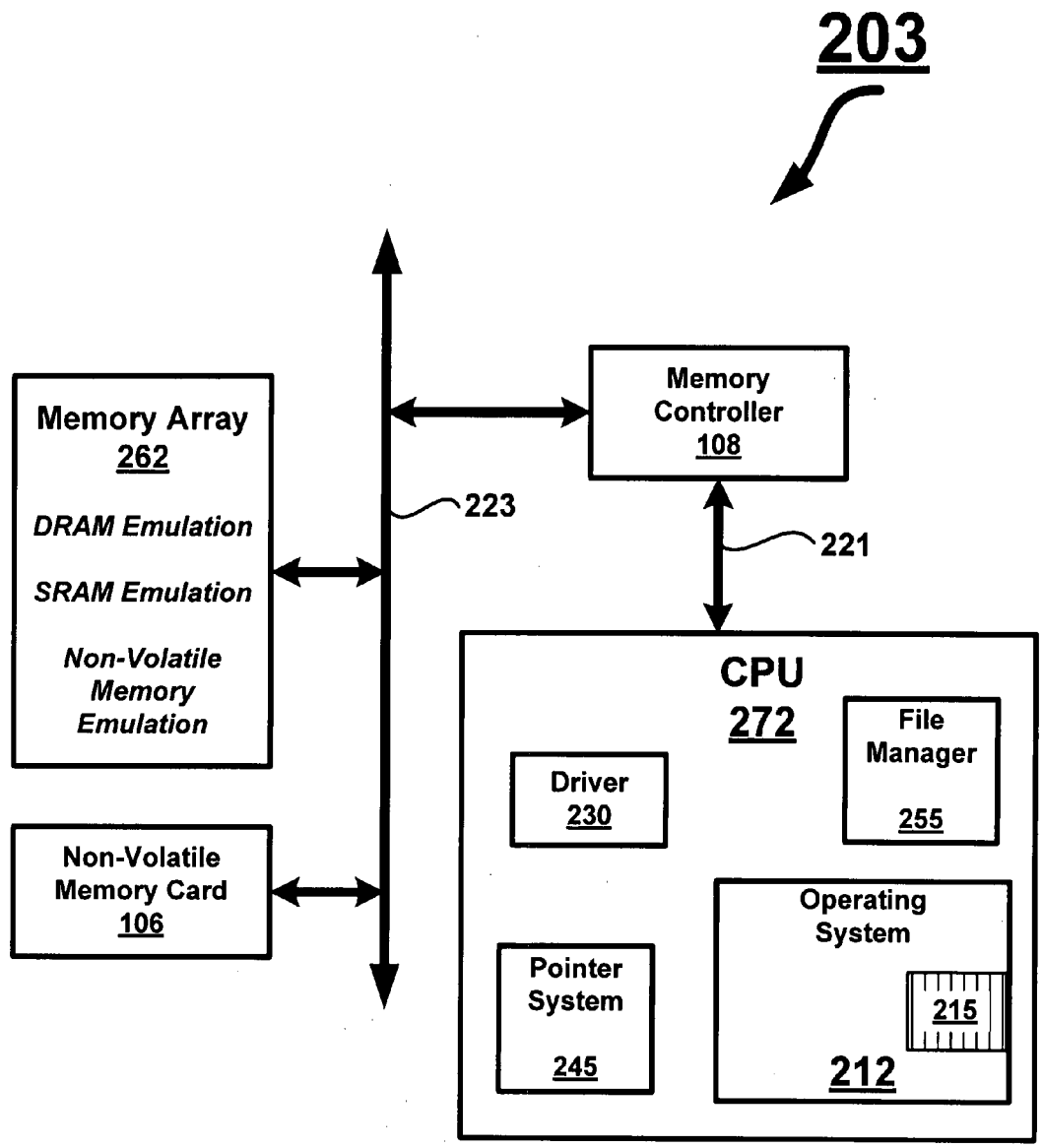
FIG. 2D is an exemplary representation of a memory system in an electronic organizer using a non-volatile memory array to replace and emulate DRAM, non-volatile memory, and SRAM.

FIG. 2D is an exemplary representation of a memory system 203 in which a non-volatile memory array 262 may be used to replace and emulate a combination of DRAM 102, non-volatile memory 105, and SRAM 104. That is, non-volatile memory array 262 can be accessed randomly (e.g., using PIO or DMA) while eliminating the need for either the refresh operation such as that used with DRAM 102, the erase operation such as that used with non-volatile memory 105, or selecting a subsection of memory for a particular purpose such as a scratchpad in the SRAM 104, thus simplifying operations for CPU 272. File manager 255 may be configured to understand the file structure of the non-volatile memory array 262 and may be used to translate data from the non-volatile memory array 262 to the CPU bus 221. Memory controller 108 may be used to perform interface functions for the non-volatile memory array 262. CPU 272 may include file manager 255, non-volatile memory card 106, driver 230, and operating system 212 bearing polling load 215. Note that the Flash File System load 220 has been eliminated from operating system 212 and driver 225 has been eliminated from CPU 272. In this system, the DRAM 102, the non-volatile memory 105, and the SRAM 104 have been replaced with non-volatile memory array 262 thus eliminating the need for the refresh operation associated with DRAM 102, eliminating the erase operation associated with non-volatile memory 105, and eliminating the expense associated with SRAM 104 while maintaining fast random DMA read/write access and adding non-volatile functionality in place of the volatile functionality of SRAM 104 and DRAM 102 memory. In some embodiments, DMA functions may be maintained or added as well.

Figure 2E:
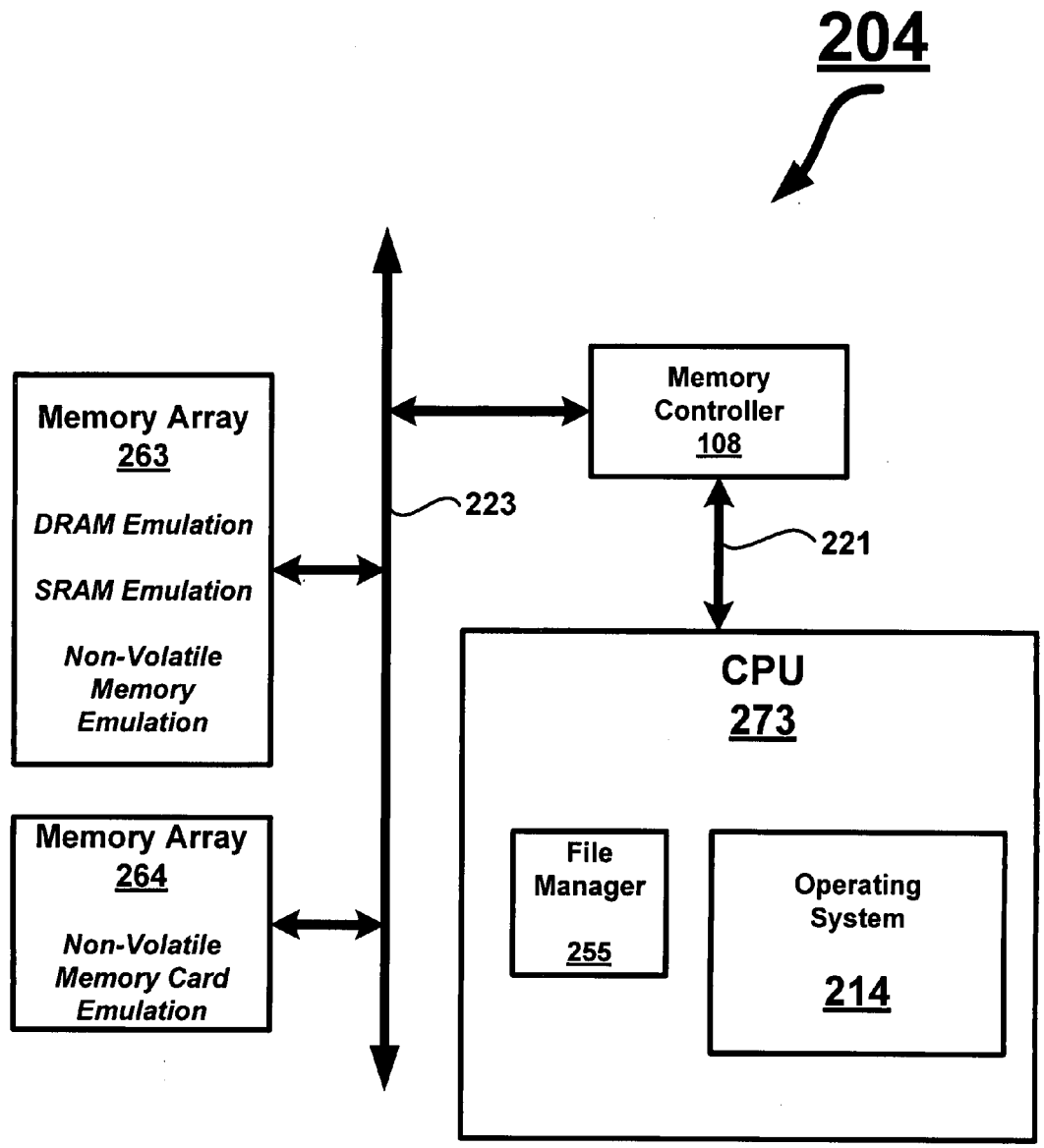
FIG. 2E is an exemplary representation of a memory system in an electronic organizer using a non-volatile memory array to replace and emulate DRAM, non-volatile memory, and SRAM, and using a memory array card to replace and emulate a non-volatile memory card.

FIG. 2E is an exemplary representation of a memory system 204 in which a non-volatile memory array 263 may be used to replace and emulate a combination of DRAM 102, non-volatile memory 105, and SRAM 104, and a non-volatile memory array card 264 may be used to replace and emulate non-volatile memory card 106. That is, non-volatile memory array card 264 may be accessed randomly (e.g., using PIO or DMA) while eliminating the need for erase operation such as that used with non-volatile memory card 106, thus simplifying operations for CPU 273. File manager 255 may be configured to understand the file structure of the non-volatile memory array 263 and the non-volatile memory array card 264 and may be used to translate data from the non-volatile memory arrays 263 and 264 to the CPU bus 221. Memory controller 108 may be used to perform interface functions for non-volatile memory arrays 263 and 264. CPU 273 includes operating system 214. Note that the Flash File System load 220, polling load 215, and pointer system 245 have been eliminated from operating system 214. Moreover, drivers 225 and 230 have been eliminated from CPU 273. In this system, the DRAM 102, the non-volatile memory 105, and SRAM 104 have been replaced with non-volatile memory array 263, while non-volatile memory card 106 has been replaced with non-volatile memory array card 264 thus eliminating the need for the refresh operation associated with DRAM 102, eliminating the erase operation associated with both the non-volatile memory 105 and non-volatile memory card 106, and eliminating the expense associated with SRAM 104 while maintaining fast DMA read/write access, portable storage features, and non-volatile memory functionality. In some embodiments the replacement of SRAM 104, DRAM 102, and non-volatile memory 105 (e.g., FLASH RAM) may be implemented using a single non-volatile memory array. In some other embodiments, the replacement of SRAM 104, DRAM 102, and non-volatile memory 105 (e.g., FLASH RAM) may be implemented using a plurality of separate non-volatile memory arrays. In an electronic organizer configured to accept a plurality of non-volatile memory cards 106, one or more of the non-volatile memory array cards 264 may be used to replace the non-volatile memory cards 106. When all of the non-volatile memory cards 106 are replaced by the non-volatile memory array cards 264, the aforementioned polling load 215 and driver 230 can be eliminated.

Figure 3:
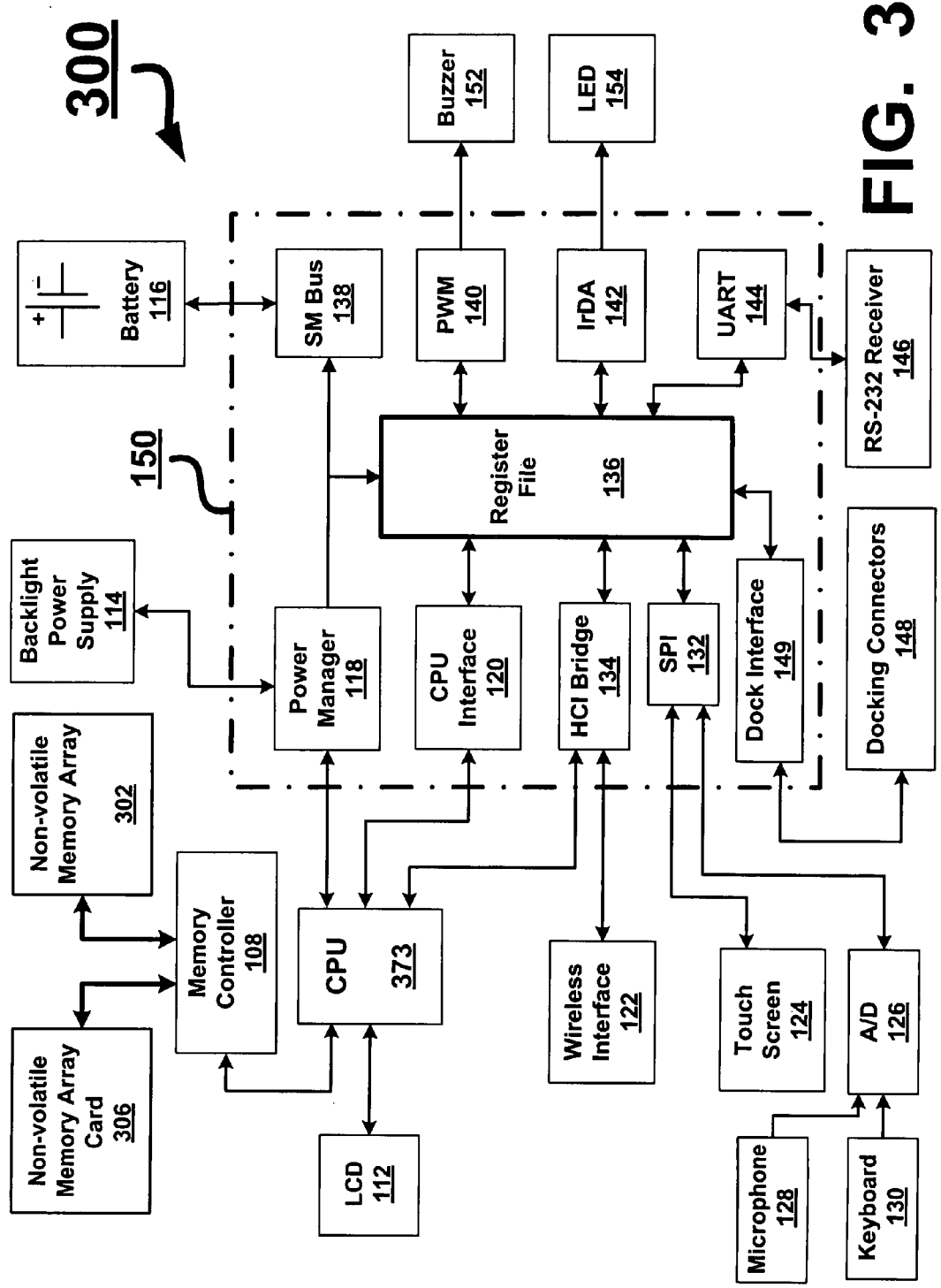
FIG. 3 is an exemplary representation of an electronic organizer using a non-volatile memory array and a non-volatile memory array card to replace and emulate multiple memory types.

FIG. 3 is an exemplary representation of an electronic organizer 300 using non-volatile memory array technology. Non-volatile memory array 302 has replaced and emulates DRAM 102, SRAM 104 and non-volatile memory 105, and non-volatile memory array card 306 has replaced and emulates the non-volatile memory card 106 in electronic organizer 300. This configuration uses directly accessed non-volatile memory arrays and therefore has eliminated inefficiencies in memory processing for electronic organizers. The refresh process has been eliminated. The erase process has been eliminated. The FLASH File System has been eliminated. The drivers and loads for the FLASH memory have been eliminated. Data movement processes associated with FLASH memory have been eliminated. Elimination of CPU 373 burdening activity results in a more efficient electronic organizer 300.

One skilled in the art will appreciate that the electronic organizer 300 can include more than one removable non-volatile memory array card 306, for example, the electronic organizer 300 can include a plurality of card slots with each card slot operable to receive a removable non-volatile memory array card 306. The data storage capacity of the removable non-volatile memory array cards 306 need not be identical. The non-volatile memory array cards 306 can be configured to conform to industry standard form factors for removable memory cards, such as SD™, SDHC™, miniSD™, micro-SD™, microSDHC™, TransFlash™, CompactFlash®, and Memory Stick®, for example. Moreover, the electronic organizer 300 can include more than one non-volatile memory array 302. For example, one non-volatile memory array 302 can replace and emulate SRAM 104 and non-volatile memory 105 and another non-volatile memory array 302 can replace and emulate DRAM 102. A PC board or other structure in the electronic organizer 300 can include a plurality of memory slots (not shown) that allow for memory capacity to be increased or decreased by adding or removing non-volatile memory arrays 302 to/from available memory slots. As one example, in electronic organizer where DRAM is replaced and emulated by non-volatile memory array 302, emulated DRAM storage capacity can be increased by adding one or more additional non-volatile memory arrays 302 to available memory slots. Data stored in the non-volatile memory array(s) can include but is not limited to file data, image data, audio data, compressed data, packet data, video data, program data, and executable code data, just to name a few.

What is claimed is:

1. An electronic organizer, comprising:
a logic block;
a memory controller;
a processing unit electrically coupled with the logic block and the memory controller, the processing unit including programmed instructions for an electronic organizer operating system; and
at least one non-volatile two-terminal cross-point memory array that is directly addressed and operative to store non-volatile data in the absence of electrical power, the non-volatile two-terminal cross-point memory array is in contact with and is fabricated directly above a silicon substrate including circuitry fabricated on the silicon substrate and electrically coupled with the non-volatile two-terminal cross-point memory array and with the memory controller, the circuitry configured to perform data operations on the non-volatile two-terminal cross-point memory array, the at least one non-volatile two-terminal cross-point memory array is configured to replace Flash memory and to replace volatile memory, the circuitry is configured to emulate Flash memory data operations on replaced Flash memory without performing a Flash erase operation prior to a write operation, and the circuitry is configured to emulate volatile memory data operations on replaced volatile memory.

2. The electronic organizer of claim 1, wherein the at least one non-volatile two-terminal cross-point memory array is randomly accessed.

3. The electronic organizer of claim 1, wherein the memory controller includes a direct memory addressing (DMA) channel, the processing unit includes a file manager, and the data is accessed by the DMA channel operating in cooperation with the file manager.

4. The electronic organizer of claim 1, wherein the at least one non-volatile two-terminal cross-point memory array is operative to replace and emulate dynamic random access memory (DRAM).

5. The electronic organizer of claim 4, wherein the data is retained without performing a DRAM refresh operation to the at least one non-volatile two-terminal cross-point memory array.

6. The electronic organizer of claim 1, wherein the at least one non-volatile two-terminal cross-point memory array is operative to replace and emulate static random access memory (SRAM).

7. The electronic organizer of claim 1, wherein consecutive write operations can be performed on replaced Flash memory without a prior Flash erase operation.

8. The electronic organizer of claim 1, wherein the at least one non-volatile two-terminal cross-point memory array is operative to replace and emulate a removable Flash memory card, and the data is retained when the at least one non-volatile two-terminal cross-point memory array is removed from the electronic organizer.

9. The electronic organizer of claim 8, wherein writing the data to the Flash memory card does not require a prior Flash erase operation.

10. The electronic organizer of claim 8, wherein consecutive write operations to the Flash memory card do not require a prior Flash erase operation.

11. The electronic organizer of claim 8, wherein the at least one non-volatile two-terminal cross-point memory array comprises multiple layers of vertically stacked cross-point arrays, each layer is in contact with an adjacent layer and the multiple layers are in contact with and are fabricated directly above the silicon substrate.

12. The electronic organizer of claim 1, wherein the electronic organizer is a component of a device selected from the group consisting of a mobile phone, a personal digital assistant (PDA), a portable electronic device, a device including electronic organizer functionality, and any combination of those devices.

13. The electronic organizer of claim 1, wherein data operations to the at least one non-volatile two-terminal cross-point memory array occur at a potential difference that is less than approximately 7 volts.

14. The electronic organizer of claim 1, wherein the at least one non-volatile two-terminal cross-point memory array comprises multiple layers of vertically-stacked cross-point arrays, each layer is in contact with an adjacent layer and the multiple layers are in contact with and are fabricated directly above the silicon substrate.

15. The electronic organizer of claim 1, wherein the logic block comprises a device selected from the group consisting of a programmable logic device, a field programmable gate array (FPGA), an application specific integrated circuit (ASIC), or any combination of those devices.

16. An electronic organizer, comprising:
a logic block;
a memory controller;
a processing unit electrically coupled with the logic block and the memory controller, the processing unit including programmed instructions for an electronic organizer operating system; and
a plurality of non-volatile two-terminal cross-point memory arrays that are directly addressed and operative to store non-volatile data in the absence of electrical power, the plurality of non-volatile two-terminal cross-point memory arrays are in contact with and are fabricated directly above a silicon substrate including circuitry fabricated on the silicon substrate and electrically coupled with the plurality of non-volatile two-terminal cross-point memory arrays and with the memory controller, the circuitry configured to perform data operations on the plurality of non-volatile two-terminal cross-point memory arrays, the plurality of non-volatile two-terminal cross-point memory arrays are configured to replace Flash memory and to replace volatile memory, the circuitry is configured to emulate Flash memory data operations on replaced Flash memory without performing a Flash erase operation prior to a write operation, and the circuitry is configured to emulate volatile memory data operations on replaced volatile memory.

17. The electronic organizer of claim 16, wherein the memory controller includes a direct memory addressing (DMA) channel, the processing unit includes a file manager, and the data is accessed by the DMA channel operating in cooperation with the file manager.

18. The electronic organizer of claim 16, wherein at least one of the plurality of non-volatile two-terminal cross-point memory arrays is operative to replace and to emulate a memory type selected from the group consisting of dynamic random access memory (DRAM), static random access memory (SRAM), non-volatile random access Flash memory, a removable non-volatile Flash memory card, and any combination of those memory types.

19. The electronic organizer of claim 18, wherein the data is retained without a DRAM refresh operation to the DRAM.

20. The electronic organizer of claim 16, wherein consecutive write operations can be performed on replaced Flash memory without a prior Flash erase operation.

21. The electronic organizer of claim 16, wherein data operations to the plurality of non-volatile two-terminal cross-point memory arrays occur at a potential difference that is less than approximately 7 volts.

22. The electronic organizer of claim 16, wherein at least one of the plurality of non-volatile two-terminal cross-point memory arrays is disposed in one of a plurality of layers of vertically-stacked cross-point arrays, each layer is in contact with an adjacent layer and the plurality of layers are in contact with and are fabricated directly above the silicon substrate.

* * * * *